United States Patent
Shi et al.

(10) Patent No.: US 8,103,086 B2
(45) Date of Patent: Jan. 24, 2012

(54) RETICLE DEFECT INSPECTION WITH MODEL-BASED THIN LINE APPROACHES

(75) Inventors: Ruifang Shi, Cupertino, CA (US); Xiaochun Li, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 12/871,821

(22) Filed: Aug. 30, 2010

(65) Prior Publication Data
US 2011/0299759 A1   Dec. 8, 2011

Related U.S. Application Data

(63) Continuation-in-part of application No. 11/622,432, filed on Jan. 11, 2007, now Pat. No. 7,873,204.

(51) Int. Cl.
*G06K 9/62* (2006.01)
(52) U.S. Cl. ........................................ 382/144
(58) Field of Classification Search .................. None
See application file for complete search history.

(56) References Cited

U.S. PATENT DOCUMENTS

| | | | |
|---|---|---|---|
| 6,577,994 B1 | 6/2003 | Tsukuda | |
| 7,440,093 B1 * | 10/2008 | Xiong et al. | 356/237.4 |
| 2002/0152452 A1 | 10/2002 | Socha | |
| 2002/0192578 A1 | 12/2002 | Tanaka et al. | |
| 2003/0082463 A1 | 5/2003 | Laidig et al. | |
| 2004/0228515 A1 | 11/2004 | Okabe et al. | |
| 2005/0210437 A1 | 9/2005 | Shi et al. | |
| 2006/0270072 A1 | 11/2006 | Ikenaga et al. | |
| 2008/0163140 A1 * | 7/2008 | Fouquet et al. | 716/4 |
| 2008/0170773 A1 * | 7/2008 | Wihl et al. | 382/144 |
| 2010/0141925 A1 * | 6/2010 | Cao et al. | 355/77 |

OTHER PUBLICATIONS

Gallagher et al, "SMO Photomask Inspection in the Lithographic Plane", Photomask Technology 2009, Proc. of SPIE vol. 7488 748807-1.
Wihl et al., U.S. Application entitled "Method for Detecting Lithographically Significant Defects on Reticles", filed Jan. 11, 2007, U.S. Appl. No. 11/622,432.
Shi et al., U.S. Application entitled "Wafer Plane Detection of Lithographically Significant Contamination", filed Aug. 30, 2010, U.S. Appl. No. 12/871,813.

(Continued)

*Primary Examiner* — Brian Werner
(74) *Attorney, Agent, or Firm* — Weaver Austin Villeneuve & Sampson LLP

(57) ABSTRACT

Provided are novel inspection methods and systems for inspecting photomasks to identify various defects using a model-based approach and information obtained from modeled images. Modeled or simulation images are generated directly from test or reference images. Some examples include aerial images that represent expected patterns projected by a lithography system on a substrate as well as photoresist images that represent expected resist patterns. Test images are first represented as a band limited mask pattern, which may include only linear terms for faster image processing. This pattern is then used to construct a modeled image, which in turn is used to construct a model-based feature map. This map serves as a base for inspecting the original test images to identify photomask defects and may include information that allows differentiating between various feature types based on their lithographic significance and other characteristics.

28 Claims, 3 Drawing Sheets

OTHER PUBLICATIONS

Kikuiri et al., "Development of Advanced Reticle Inspection Apparatus for Hp 65 Nm Node Device and Beyond", Photomask and Next-Generation Lithography Mask Technology XIII. Edited by Hoga, Morihisa. Proceedings of the SPIE, vol. 6283, pp. 62830Y (2006).

International Search Report and Written Opinion for PCT Application PCT/US2008/050914, dated Jul. 14, 2009.

U.S. Office Action for U.S. Appl. No. 11/622,432 mailed Mar. 11, 2010.

U.S. Notice of Allowance for U.S. Appl. No. 11/622,432 mailed Jul. 20, 2010.

* cited by examiner

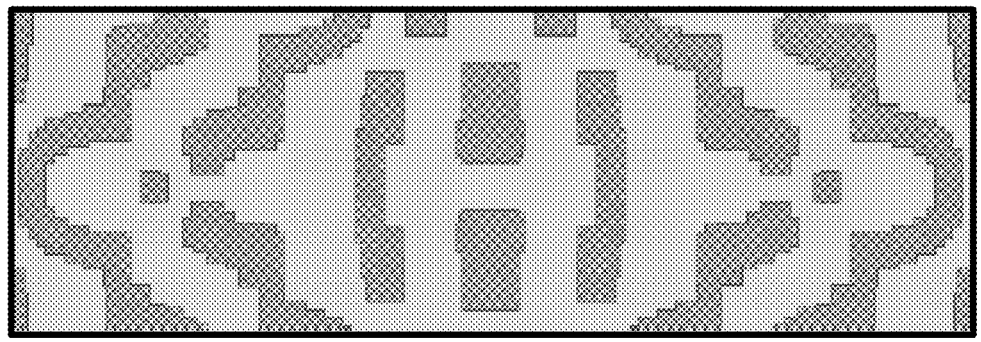
*FIG. 1A*  *Prior Art*
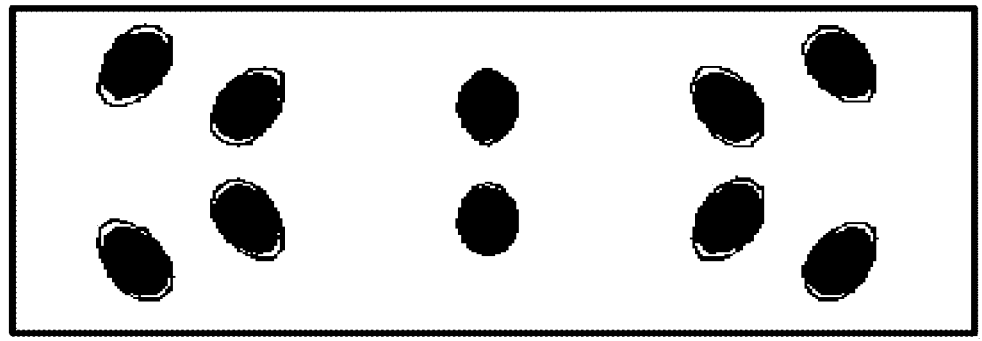
*FIG. 1B*  *Prior Art*

RETICLE DEFECT INSPECTION WITH MODEL-BASED THIN LINE APPROACHES

CROSS-REFERENCE TO RELATED APPLICATIONS

This application is a Continuation-in-Part application of U.S. patent application Ser. No. 11/622,432, entitled "METHOD FOR DETECTING LITHOGRAPHICALLY SIGNIFICANT DEFECTS ON RETICLES," filed on Jan. 11, 2007, to Wihl et al., which is incorporated herein by reference in its entirety for all purposes.

BACKGROUND

As densities and complexities of integrated circuits (ICs) continue to increase, inspecting photomask patterns become progressively more challenging. Every new generation of ICs has denser and more complex patterns that currently reach and exceed optical limitations of lithographic systems. To overcome these optical limitations, various Resolution Enhancement Techniques (RET), such as Optical Proximity Correction (OPC), have been introduced. For example, OPC helps to overcome some diffraction limitations by modifying photomask patterns such that the resulting printed patterns correspond to the original desired patterns. Such modifications can include perturbations to sizes and edges of main IC features, i.e., printable features. Other modifications involve additions of serifs to pattern corners and/or providing nearby sub-resolution assist features (SRAFs), which are not expected to result in printed features and, therefore, are referred to as non-printable features. These non-printable features are expected to cancel pattern perturbations that would otherwise have occurred during the printing process. However, OPC makes mask patterns even more complex and usually very dissimilar to resulting wafer images. Furthermore, OPC defects often do not translate into printable defects.

Non-printable and printable features have different effects on resulting printed patterns and often need to be inspected using different inspection parameters, e.g., sensitivity levels. Areas containing non-printable features are typically "de-sensed" to avoid false positives during inspection. Conventional inspection methods generally rely on user defined characteristics, such as feature sizes, for differentiating between printable and non-printable features. This approach is sometimes referred to as rule-based, where a user defines specific rules for feature identification. However, in many modern ICs non-printable features often can be larger than printable features. Furthermore, identifying areas containing non-printable is complex and consumes much inspection resources.

SUMMARY

Provided are novel inspection methods and systems for inspecting photomasks to identify various defects using a model-based approach and information obtained from modeled images. Modeled or simulation images are generated directly from test or reference images. Some examples include aerial images that represent expected patterns projected by a lithography system on a substrate as well as photoresist images that represent expected resist patterns. Test images are first represented as a band limited mask pattern, which may include only linear terms for faster image processing. This pattern is then used to construct a modeled image, which in turn is used to construct a model-based feature map. This map serves as a base for inspecting the original test images to identify photomask defects and may include information that allows differentiating between various feature types based on their lithographic significance and other characteristics.

In certain embodiments, a method for inspecting a photomask to identify lithographically significant defects involves providing the photomask, producing test light intensity images of the photomask using an inspection apparatus, and constructing a band limited mask pattern. The photomask includes one or more printable features and one or more non-printable features. The photomask is configured to achieve lithographic transfer of the printable features onto a substrate using a lithography system. The produced test light intensity images include a test transmission image and a test reflection image. The method then proceeds with providing a model of the lithography system and constructing an aerial image from the band limited mask pattern by applying the lithography system model to the pattern. A model-based feature map is then built using the aerial image of the mask pattern, and, finally, the test light intensity images are analyzed using the model-based feature map to identify lithographically significant defects.

In certain embodiments, a method also involves obtaining reference light intensity images of a reference die, e.g., a reference transmission image and a reference reflection image of the photomask. The band limited mask pattern may be constructed using also the reference light intensity images. The test light intensity images are typically aligned with the reference light intensity images. For example, the test transmission image is aligned with respect to the test reflection image, the reference transmission image is aligned with respect to the reference reflection image, while the reference transmission image is aligned with respect to the test transmission image or the reference reflection image is aligned with respect to the test reflection image. In general, at least the test transmission image is aligned with respect to the test reflection image regardless of the source of reference images, e.g., a reference die (in a die-to-die inspection mode) or rasterized database image (in a die-to-database mode).

In certain embodiments, analyzing test light intensity images based on a model-based feature map involves the following two operations: identifying portions of aligned test images and corresponding portions of the aligned reference images and identifying any differences between these two types of images. Specifically, differences between an aligned test transmission image and aligned reference transmission image as well as differences between an aligned test reflection image and aligned reference reflection image are determined for each identified portion. Specific portions of the analyzed images are identified in a model-based feature map. The identified portions containing the one or more printable features can be inspected with higher sensitivity than the identified portions containing the one or more non-printable features. The model-based feature map includes areas corresponding to the identified portions containing the one or more non-printable features.

In certain embodiments, building a model-based feature map involves identifying low light intensity areas and high light intensity areas of the aerial image. The low light intensity areas correspond to the one or more printable features, while the high light intensity areas correspond to the one non-printable feature. Analyzing a test light intensity images using a model-based feature map may involve aligning the test light intensity images with the model-based feature map.

In certain embodiments, reference images are obtained from a database model of the printed pattern (i.e., a die-to-database inspection mode). In other embodiments, reference images are obtained from a reference die (i.e., a die-to-die inspection mode). Non-printable features may include Sub-Resolution Assist Features (SRAF) as well as other types of Optical Proximity Correction (OPC) features. In certain embodiments, at least one of the non-printable features is larger than at least one of the printable features. In the same or other embodiments, at least one printable feature on a photomask is less than about 200 nanometers or even less than about 100 nanometers.

Constructing an aerial image may involve at least some separating non-printable features from printable features based, e.g., on optical intensity distributions in a band limited mask pattern. In the same or other embodiments, constructing an aerial image involves excluding some or all non-printable features from a modeled image, e.g., an aerial image. In certain embodiments, an inspection method also involves constructing a geometrical map based on a band limited mask pattern for classifying geometrical features into one or more geometrical feature types, such as edges, corners, and line ends. The geometrical map may be used to classify pattern features during analyzing of the test images. Furthermore, analyzing the test images may involve applying different detection thresholds to at least two different geometrical feature types of the geometrical map.

In certain embodiments, a model-based feature map includes a plurality of image portions each having a corresponding Mask Error Enhancement Factor (MEEF). The method may involve automatically adjusting sensitivity levels for each image portion based on the corresponding MEEFs during analyzing of the test images. In certain embodiments, a method involves providing a user-defined sensitivity levels for analyzing the test image. In certain embodiments, a subset of areas corresponding to one or more printable features is analyzed with higher sensitivity than another subset of these areas corresponding to one or more non-printable features. In the same or other embodiments, a band limited mask pattern includes only linear terms. In other embodiments, a band limited mask patterns includes one or more quadratic terms.

In certain embodiments, a lithography system model includes at least one or more of the following parameters: numerical apertures of a lithographic system and an inspection apparatus, wavelengths of the lithographic system and the inspection apparatus, and illumination conditions of the lithographic system and the inspection apparatus. In certain embodiments, constructing an aerial image involves removing band limiting effects of the inspection apparatus.

In certain embodiments, provided is a system for inspecting a photomask to identify lithographically significant defects that includes at least one memory and at least one processor that are configured to perform the following operations: producing test light intensity images of a photomask that include a test transmission image and a test reflection image, constructing a band limited mask pattern, constructing an aerial image of the band limited mask pattern by applying a lithography system model to the band limited mask pattern, building a model-based feature map using the aerial image of the mask pattern, and analyzing the test light intensity images using the model-based feature map to identify any lithographically significant defects.

These and other aspects of the invention are described further below with reference to the figures.

BRIEF DESCRIPTION OF THE DRAWINGS

FIG. 1A illustrates a base pattern provided on a photomask in accordance with certain embodiments.

FIG. 1B illustrates a resulting wafer image of the base pattern in FIG. 1A after a lithographic transfer.

DETAILED DESCRIPTION OF EXAMPLE EMBODIMENTS

Figure 1C:
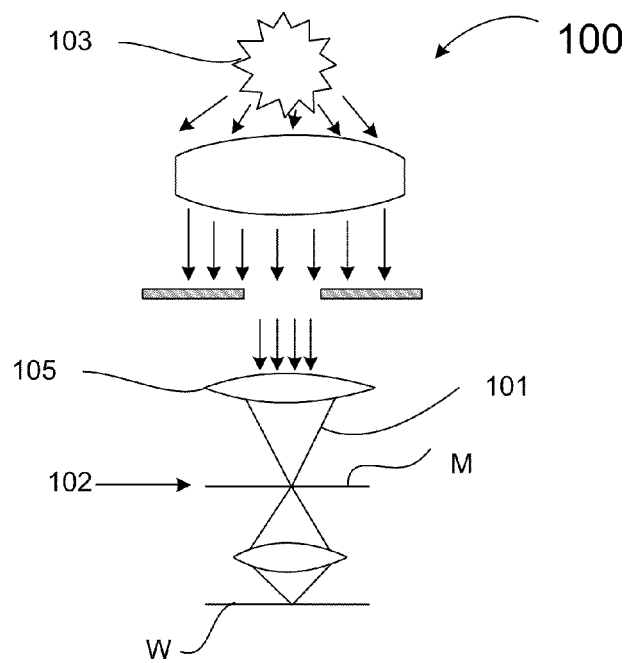
FIG. 1C is a simplified schematic representation of a lithographic system for transferring a mask pattern from a photomask onto a wafer in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

Many conventional photomask inspection methods use a rule-based approach for separating printable features (also referred to as main features) from non-printable ones (also referred to as thin lines) for later "de-sensing" areas containing non-printable features. A test image and/or reference image are used to create a feature map based on a rule set by a user. Usually, a user defines a line width as criteria for separating non-printable features from printable ones. Not only are these rule-based methods complex, there is usually no way of distinguishing between main features and thin lines that are similar as often the case in modern ICs. A brief description of a rule-based thin line "de-sense" method using a reference die may help to better illustrate its complexities and deficiencies.

A rule-based method starts with capturing reference and test images. An intensity threshold is applied to these images to define a "skeleton" of the features, which is a collection of the image areas with intensity values within this threshold. Photomasks are often designed with different types of thin lines, such as opaque thin lines and clear thin lines, which add additional complexities in defining a "skeleton." Opaque thin lines are thin stripes or dots of molybdenum-silicon that appear darker than their surroundings on a transmitted image. On the hand, clear thin lines are thin stripes or dots of cuts made on molybdenum-silicon/chrome surfaces that appear darker than these surrounding surfaces on a reflected image. Furthermore, in a die-to-die inspection, defect areas are not apparent from the test and reference images. As such, a combined analysis of the reference and test images needs to be performed. In a next operation, line widths of skeleton features are measured to differentiate between thin lines and main features to form a "raw" feature map. As mentioned above, a rule containing this line width threshold is set by a user.

At this point, a rule-based "de-sense" algorithm may fail to accomplish its purpose of differentiating between thin lines and main features on photomasks including modern IC designs. This often is referred to as a "breaking down" of the algorithm. Modern ICs have thin lines, as they appear on the photomask and resulting test and reference images, comparable in size to main features and could be even larger. In other words, a line width can not often be used as criteria at this stage to differentiate between these two types of features. If a process is allowed to proceed forward applying a conventional line-width rule, regions corresponding to main features may appear in a constructed feature map (instead of or in addition to areas corresponding to thin lines) and, as a result, become "de-sensed" during subsequent inspection of the photomask based on this feature map. This de-sensing, in turn, may lead to many critical defects passing through the inspection undetected because an adequate sensitivity level was not applied for inspection of critical defects. At the same time, many thin line features may not be captured in the feature map and subsequently be inspected with high sensitivity resulting in slow inspection and rejection of potentially acceptable photomasks. An inspector is usually not capable of catching "false positives" and "false negatives" because of the complexity of the inspected images and little resemblance between the photomask and wafer level images. This could be further illustrated from the following example. FIG. 1A illustrates an illustrative base pattern provided on a photomask, while FIG. 1B illustrates a resulting wafer image of that base pattern. There is very little, if any, resemblance between the two images. Extensive uses of OPC lead to such discrepancies.

The "raw" feature map is generally designed to include only thin-line skeleton features or, more specifically, areas corresponding to these thin line features. As evidenced above, this design criterion is often not achieved with a rule-based "de-sense" approach. The skeleton features of the "raw" feature map are then expanded in size (i.e., dilated) to create some extended boundaries around thin-lines features that would accommodate for variation in feature sizes, positions, and alignment tolerances between the feature map and inspected images. The dilated features form a final feature map, which in turn is used to "de-sense" inspected images. Specifically, a lower sensitivity is applied in the dilated areas of the feature map. As it can be seen from the above description, rule-based approaches are very complex and have significant limitation in particular when applied to modern ICs.

Novel methods and systems described herein solve some of these problems. Instead of relying on photomask images to construct a feature map as described above, novel methods proceed with developing a modeled image of the resulting IC as it would be projected on a wafer by a lithographic system or would be developed using a photoresist system. The modeled image does not include thin lines, but account for OPC effects of the thin lines. This modeled image is then used to construct a model-based feature map without a need for separate rules to differentiate between thin lines and main features.

Model-based inspection methods similarly start with capturing one or more test images of a photomask, such a transmission test image and a reflection test image. A corresponding set of reference images could be obtained from a reference die in a die-to-die inspection mode or from a database in a die-to-database mode. The test and reference images are typically aligned. A mask pattern recovery algorithm is then deployed to combine transmission and reflection images (either the reference images or test images) into a band limited mask pattern, which is an amplitude representation of the inspected photomask. However, instead of relying on photomask images to build a rule-based feature map based on a user defined rule, a process proceeds with constructing a modeled image (e.g., an aerial image or a photoresist image) that, in turn, is used to build a model-based feature map. The modeled image may be designed to include only printable features (at a certain modeled level, such an aerial plane or a photoresist plane) and, therefore, serves a good basis for constructing a feature map without a need for user defined rules. Overall, the modeled based images makes it much easier to separate thin lines from main features then conventionally used photomask images.

More specifically, in subsequent operations, characteristics of an inspection system, lithographic system, and, in certain embodiments, a photoresist process, are used to construct a modeled image (e.g., an aerial image or a pattern image) from the band limited mask pattern. For example, a lithography system model provided into the inspection method may include the following stepper conditions: numerical apertures, wavelength, and illumination conditions. Other model components may include various characteristics of an inspection system and, in certain embodiments, a photoresist system. The modeled image closely represents a lithographically projected image or photoresist patterned image and typically does not include non-printable feature. At the same time, the modeled image accounts for various effects of non-printable features (e.g., OPC). It is important to point out again that there is often lack of similarity between photomask images and wafer images because of modern OPC complexities as evidenced from FIGS. 1A and 1B. Therefore, it is hard to determine from the photomask images, which areas need to be "de-sensed" and which ones need to be inspected with higher sensitivity levels. This model-based approach focuses on lithographically significant defects and ignores many other types of defects that are irrelevant during lithographic exposure or photoresist development.

The modeled image is then used to construct a model-based feature map. This map specifically defines and focuses on areas that contain lithographically significant features and defects. The map is used to provide instructions the inspection system to "de-sense" all other areas during subsequent inspection (e.g., areas corresponding to "dilated skeleton" features as described above). Because this model-based feature map is generated from the modeled images (e.g., an image in an aerial plane) as opposed to a rule-based feature map generated by rule-defined sorting of features in a photomask image, the model-based feature map automatically accounts lithographically significant areas and ignores other areas regardless of the feature sizes. In other words, user-defined rules are not needed for constructing a feature map. Instead, a model of a lithography system or of a photoresist system is applied to retrieve a modeled image that defines printable features' areas.

This model-based feature map is then used to analyze test images (e.g., an image in a reticle image plane, more specifically, the original images obtained from a photomask). Each area defined by this model-based map may have it own Mask Error Enhancement Factor (MEEF) and other characteristics allowing for more specific inspection of the critical portions of the photomask. For example, areas containing only thin lines (e.g., SRAFs) may be inspected with lower sensitivity than areas containing main features. As indicated above, areas of the model-based feature map distinguish between these two types of features. More generally, a feature map can differentiate between three, four, and even more types of areas that are later inspected each with specific inspection parameters. Overall, novel processes and inspection systems described herein allow more effective and less complex inspection that allows separating thin lines from main features based on the modeled-images.

Inspection System Examples

FIG. 1C is a simplified schematic representation of a typical lithographic system 100 that can be used to transfer a mask pattern from a photomask M onto a wafer W in accordance with certain embodiments. Examples of such systems include scanners and steppers, more specifically PAS 5500 system available from ASML in Veldhoven, Netherlands. In general, an illumination source 103 directs a light beam through an illumination lens 105 onto a photomask M located in a mask plane 102. The illumination lens 105 has a numeric aperture 101 at that plane 102. The value of the numerical aperture 101 impacts which defects on the photomask are lithographic significant defects and which ones are not. A portion of the beam that passes through the photomask M forms a patterned optical signal that is directed through imaging optics 153 and onto a wafer W to initiate the pattern transfer.

Figure 1D:
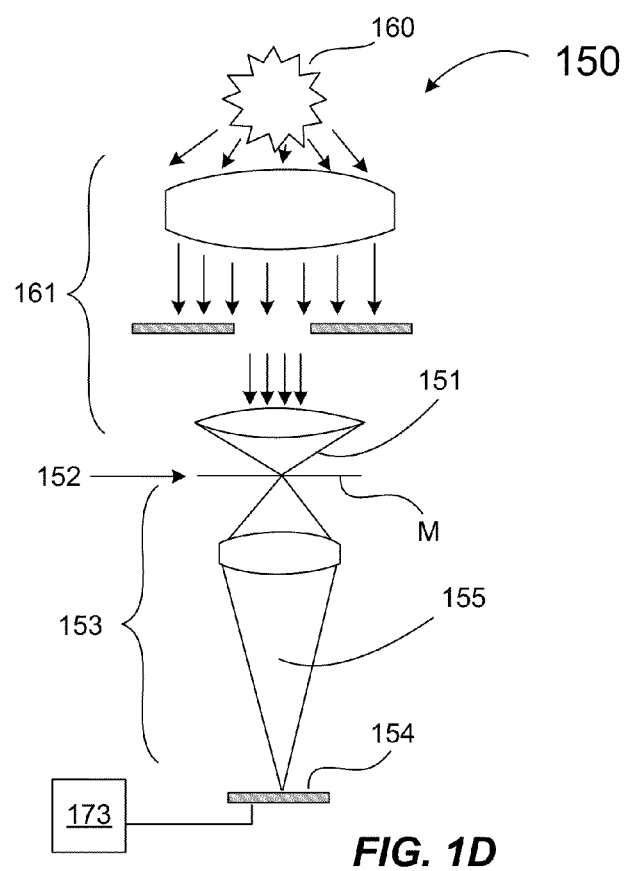
FIG. 1D provides a schematic representation of an photomask inspection apparatus in accordance with certain embodiments.

FIG. 1D provides a schematic representation of an inspection system 150 that has an imaging lens 151a with a relative large numerical aperture 151b at a reticle plane 152 in accordance with certain embodiments. The depicted inspection system 150 includes microscopic magnification optics 153 designed to provide, for example, 60-200× magnification for enhanced inspection. The numerical aperture 151b at the reticle plane 152 of the inspection system is often considerable greater than the numerical aperture 101 at the reticle plane 102 of the lithography system 100, which would result in differences between test inspection images and actual printed images. Each of these optical systems (100, 150) induces different optical effects in the produced images, which are accounted and compensated for in novel inspection techniques described herein.

Novel inspection techniques may be implemented on various specially configured inspection systems, such as the one schematically illustrated in FIG. 1D. The system 150 includes an illumination source 160 producing a light beam that is directed through illumination optics 161 onto a photomask M in the reticle plane 152. Examples of light sources include lasers or filtered lamps. In one example, the source is a 193 nm laser. As explained above, the inspection system 150 has a numerical aperture 151a at the reticle plane 152 that may be greater than a reticle plane numerical aperture (e.g., element 101 in FIG. 1C) of the corresponding lithography system. The photomask M to be inspected is placed at the reticle plane 152 and exposed to the source. The patterned image from the mask M is directed through a collection of magnification optical elements 153, which project the patterned image onto a sensor 154. Suitable sensors include charged coupled devices (CCD), CCD arrays, time delay integration (TDI) sensors, TDI sensor arrays, photomultiplier tubes (PMT), and other sensors. The signals captured by the sensor 154 can be processed by a computer system 173 or, more generally, by a signal processing device, which may include an analog-to-digital converter configured to convert analog signals from the sensor 154 into digital signals for processing. The computer system 173 may be configured to analyze intensity, phase, and/or other characteristics of the sensed light beam. The computer system 173 may be configured (e.g., with programming instructions) to provide a user interface (e.g., on a computer screen) for displaying resultant test images and other inspection characteristics. The computer system 173 may also include one or more input devices (e.g., a keyboard, mouse, joystick) for providing user input, such as changing detection threshold. In certain embodiments, the computer system 173 is configured to carry out inspection techniques detailed below. The computer system 173 typically has one or more processors coupled to input/output ports, and one or more memories via appropriate buses or other communication mechanisms.

Because such information and program instructions may be implemented on a specially configured computer system, such a system includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter. In certain embodiments, a system for inspecting a photomask includes at least one memory and at least one processor that are configured to perform the following operations: producing test light intensity images of a mask that include a test transmission image and a test reflection image, constructing a band limited mask pattern, constructing an aerial image of the band limited mask pattern by applying a lithography system model to the band limited mask pattern, building a model-based feature map using the aerial image of the mask pattern, and analyzing the test light intensity images using the model-based feature map to identify photomask defects. One example of an inspection system includes a specially configured TeraScan™ DUV inspection system available from KLA-Tencor of Milpitas, Calif.

Inspecting Methods Examples

Figure 2:
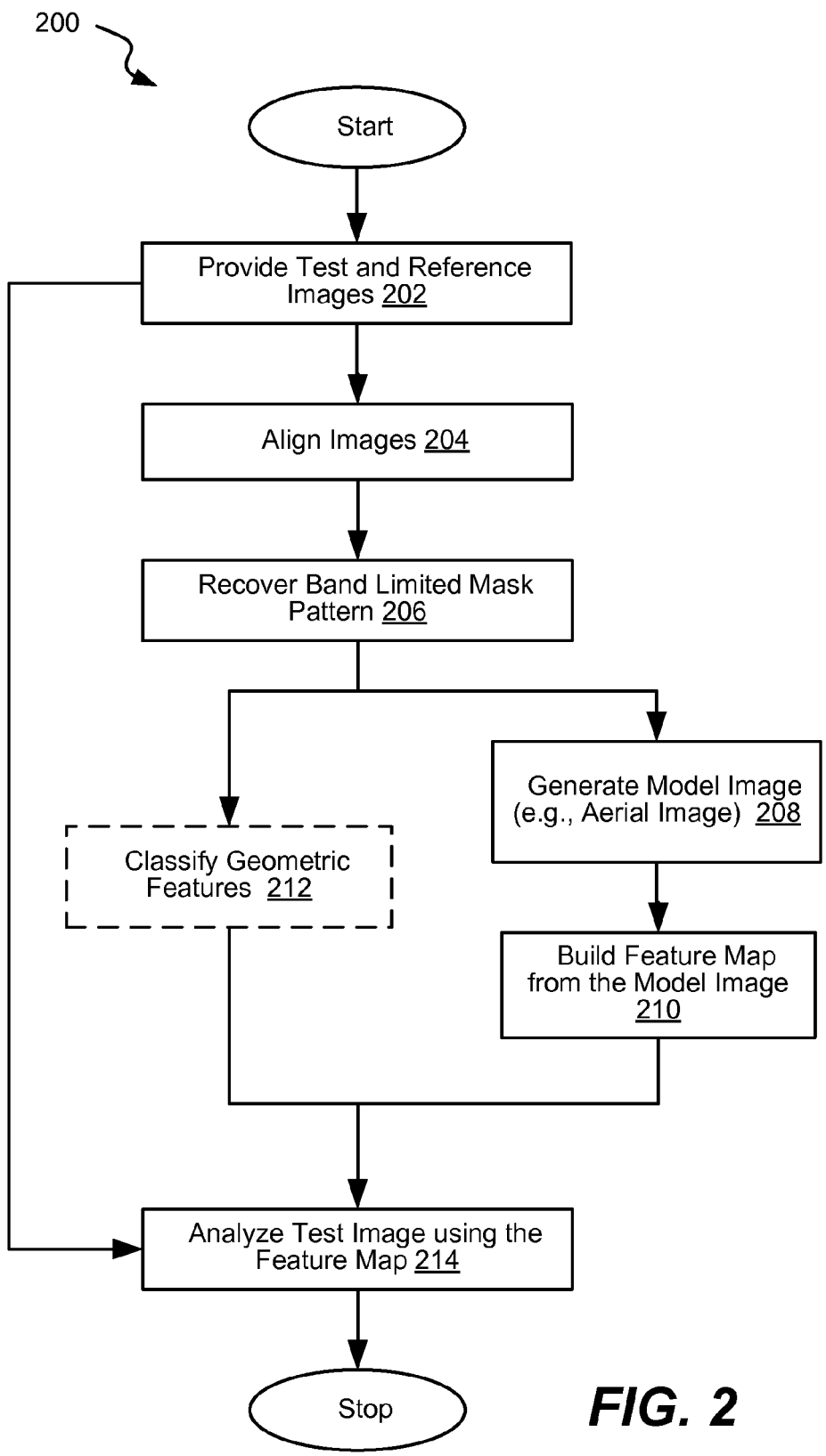
FIG. 2 illustrates a process flowchart corresponding to one example of a method for inspecting a photomask to identify defects.

FIG. 2 illustrates a process flowchart corresponding to one example of a model-based inspection method for inspecting a photomask to identify lithographically significant defects, such as contamination defects. For example, a photomask made from a transparent fused silica blank with a pattern defined by a chrome metal adsorbing film can be used. In general, various semiconductor substrates, such as reticles, photomasks, semiconductor wafers, phase shift masks, and Embedded Phase Shift Masks (EPSMs), can be inspected using this method. Various types of photomasks can be inspected using these methods. A photomask generally includes one or more printable features and one or more non-printable features. A printable feature is defined as a feature that appears on a resulting wafer image. It may or may not present in the same shape or form on a photomask. For example, FIG. 1A illustrates an illustrative base pattern provided on a photomask, while FIG. 1B illustrates a resulting wafer image of that base pattern. Therefore, in the context of a photomask, a printable feature may be understood as an area corresponding to the printable feature on a wafer plane. Non-printable features ("thin line") may include various optical proximity correction (OPC) features that are used to compensate for imaging errors due to diffraction and other reasons. One type of such features is sub-resolution assist features (SRAF). In certain embodiments, at least one non-printable feature on the provided photomask is larger than at least one printable feature.

Once the photomask is provided for the inspection process, e.g., placed on an inspection stage of the inspection system, the process may proceed with capturing one or more test images the photomask at 202. For example, the photomask may be illuminated to capture two or more light intensity images at different illumination and/or collection conditions. In one specific embodiment, a transmission light intensity image and a reflection light intensity image are captured. In other embodiments, two or more reflection images or two or more transmission images are produced while the photomask is illuminated at different wavelengths. For example, if photomask materials cause transmission to be a strong function of an illumination light wavelength, then two different but closely spaced wavelengths could be used to generate a pair of transmitted images each sensing different transmission levels. Reference images may be obtained from a database (e.g., in a die-to-database mode) or another reference die (e.g., in a die-to-die mode).

The captured test images are typically aligned in operation 204. This alignment may involve matching optical properties of the inspection system(s) for multiple test and reference images. For example, in the case of transmission and reflection images, some adjustment of the images can be made to compensate for differences in optical paths of the two respective signals. Alignment adjustments may depend on specific geometries of an inspection system used. In certain embodiment, alignment involves aligning a test transmission image with respect to a test reflection image, aligning a reference transmission image with respect to a reference reflection image, and aligning the reference transmission image with respect to the test transmission image or aligning the reference reflection image with respect to the test reflection image.

Once aligned, the test images can be processed to recover a band limited mask amplitude function at 206. This function is sometimes also referred to as a band limited mask pattern. In one approach, partially coherent optical imaging can be modeled as a sum of two or more coherent systems, which is further explained in more detail in U.S. patent application Ser. No. 11/622,432, incorporated herein by reference for purposes of describing operation 206. Specifically, the Hopkins equations for partially coherent imaging can be used to form a Transmission-Cross-Coefficient (TCC) matrix. This matrix can be then decomposed into corresponding Eigen vectors, which act as kernels of coherent systems. The Eigen value weighted sum of the intensity contributions from each of these coherent systems yields the image intensity, which can be used to represent the intensity of the transmitted signal. In certain embodiments, reflected and transmitted intensities of the test images can be represented with only linear terms that are referred to as band limited mask amplitude functions. An example of this function is presented in Equation 1.

pattern of the photomask being inspected; $E_i$ and $\lambda_i$ refer, respectively, to the Eigen Vectors and Eigen Values of associated elements of a transmission cross-coefficient (TCC) imaging matrix associated with the inspection tool; $D_i$ is the DC gain of $E_i$.

The band limited mask pattern M (x,y) is defined by the mask pattern P (x,y) convolved with a function:

$$\sum_{i=0}^{N} \lambda_i D_i E_i(x, y),$$

which is referred to as a "recovery kernel". Therefore, the band limited mask pattern is a modified version of the mask pattern function P (x,y).

The band limited mask pattern is then used in operation 208 to generate modeled test images, such as modeled test aerial images and/or modeled test resist images. Modeled images are sometimes referred to as simulation images. Lithographic and/or photoresist system models are provided for this purpose. A lithography system model may include numerical apertures of the lithographic and inspection systems, wavelengths used in lithographic and inspection systems, illumination conditions used in lithographic and inspection systems, and other lithographic and inspection parameters. For example, as further explained in U.S. patent application Ser. No. 11/622,432, basis kernels of the lithographic system model may be adjusted to back out any roll-off within the pass band of the lithographic system due to the band limited nature of the recovered mask pattern. A function ($F_i$ (x,y)) that defines a set of modified coherent bases is used to describe a modified TCC matrix for implementing the band limited mask pattern in the lithographic system model. A TCC matrix for the lithographic system may involve many terms. However, because most of the light intensity is represented in the $$\frac{\|a_R\|^2 (I_T(x, y) - \|c_T\|^2) - \|a_T\|^2 (I_R(x, y) - \|c_R\|^2)}{2\|a_R\|^2 \mathrm{Re}(a_T c_T^*) - 2\|a_T\|^2 \mathrm{Re}(a_R c_R^*)} = \sum \lambda_i D_i [P(x, y) \oplus E_i(x, y)]$$

$$= P(x, y) \oplus \sum_{i=0}^{N} \lambda_i D_i E_i(x, y)$$

$$= M(x, y)$$

[Equation 1]

where $a_R$ is the complex reflected amplitude of the difference between the mask foreground tone and the background tone; $I_T$ (x,y) describes the transmitted intensity image of a mask using the inspection system; $C_T$ is the complex transmitted amplitude of the background tone of the mask (e.g., in a quartz and chrome binary mask $C_T$ can describe properties of the chromium pattern); $a_T$ is the complex transmitted amplitude of the difference between the mask foreground tone and the background tone (e.g., using the same mask as above $a_T$ can describe the optical properties of the difference between the quartz and the chromium; $C_T$ and $a_T$ of course vary depending on the properties of the material layers described); $I_R$ (x,y) describes the reflected intensity image of a mask using the inspection system; $C_R$ is the complex reflected amplitude of the background tone of the mask and $a_R$ is the complex reflected amplitude of the difference between the mask foreground tone and the background tone; Re (x) represents the real component of x; P(x,y) defines the mask first few terms, accurate estimates can be obtained using only those terms (e.g., the first ten or so terms). Thus, if desired, a truncated model can be employed that significantly reduces the computational burden. A user can obtain a desired degree of accuracy by taking as many terms in the series as are needed for each specific photomask inspection application. Overall, application of a lithography system model allows capturing lithographic effects of non-printable features in modeled test images.

In certain embodiments, constructing modeled test images separates non-printable features from printable features based on optical intensity distributions of the band limited mask pattern. For example, non-printable features may not appear in the modeled images. A method may also involve constructing a geometrical map based on the band limited mask pattern for classifying geometrical features into one or more geometrical feature types, such as edges, corners, and line ends. Furthermore, a process of identifying the lithographically significant defects can be enhanced by applying different detection thresholds to different geometrical feature types of the geometrical map.

Lithographic and/or photoresist modeling substantially reduces a number or completely eliminates lithographically insignificant defects from the resulting simulation images. Such defects, also called "nuisance defects," have little or no effect on the printed pattern. For the purposes of this disclosure, lithographically significant defects are defined as those defects that have lithographic significance in the final printed pattern. That is to say, that some defects ("nuisance defects"), although present in the mask, have no significant impact on the printed pattern transferred to a photoresist layer. Examples include, defects so small (or on a lithographically insensitive portion of the pattern) as to be largely irrelevant. Also, a defect can be formed in a relatively defect insensitive portion of the substrate. In some cases a defect can be formed on an assist or OPC feature (or other resolution enhancement feature) but not affect the final printed pattern. Thus, a lithographically significant defect is a defect that is present on the mask and can cause a significant effect in the lithographically transferred pattern. Such lithographically significant defects can cause problems related to circuit failures, sub optimal performance, and so on.

The process continues with building a model-based feature map at 210 based on one or more model images obtained in previous operations. The model-based feature map defines various areas of the photomask that contain different types features, e.g., printable and non-printable features. In one example, a model-based feature map categorizes area including the photomask features according to their lithographic significance based on information captured in the modeled images. For example, areas containing main features may belong to one type, while areas containing SRAFs may belong to a different type. In a specific example, areas containing printing features are called in-band features. Areas containing non-printing features are labeled as out-band features. In-band features can be expanded (dilated) to cover larger regions on a photomask to establish some additional areas that may account for inspected feature size and alignment variations. In-band areas on the feature map will be inspected with higher sensitivity those out-band areas on the feature map.

A model-based feature map allows comparing two corresponding areas from two different images (e.g., a test image and a reference image). Different inspection parameters may be applied to different set of areas based on lithographic significance and other characteristics. This approach allows focusing inspection resources on areas of the model-based feature maps that have, e.g., high lithographic significance, prone to severe defects, and/or fall within some other criteria. At the same time, inspection resources are saved while inspecting other less critical areas. This is further explained in the context of operation 214 below. A model-based feature map is generated from a modeled image, e.g., an aerial image, that also accounts for optical interference effects during lithographic printing and other characteristics of a lithographic system. These characteristics can impact lithographic significance of the photomask features, which is not apparent directly from test and reference images obtained from photomasks and/or database.

Furthermore, photomask inspection methods described herein may account for Mask Error Enhancement Factors (MEEF) for different areas of a feature map. For example, a typical photomask contains pre-corrected images of the final IC that are magnified by a factor of four (or ten). While this factor helps reducing pattern sensitivity to imaging errors, small size features of modern IC circuits (e.g., 22 nanometers and less) are negatively impacted by light beam scattering during lithographic exposure. Therefore, MEEF sometimes exceeds one, e.g., dimensional errors on a wafer exposed using a 4× photomask may be more than a quarter of the dimensional error on the photomask. In certain embodiments, MEEF values captures in a model-based feature map are used for automatic adjustment of detection thresholds for corresponding image areas. For example, areas with large MEEF values can be inspected more carefully than areas with lower MEEF values. This operation may be implemented in an automated mode.

Furthermore, photomask inspection methods may involve providing one or more user-defined detection thresholds. For example, model-based feature map areas containing main features may be assigned one detection threshold, while areas containing SRAFs may be assigned a lower threshold. This differentiation can be used to optimize inspection resources.

During operation 212, geometric features may be classified based on mask pattern information. For example, a method may involve constructing a geometrical map based on a band limited mask pattern. The geometrical map may include the following categories: edges, corners, line ends, and other features. During inspection, photomask features are categorized accordingly, and, in certain embodiments, different detection thresholds are applied to different feature categories.

In operation 214, original test images are compared to reference images based on information contained in a model-based feature map. For example, test and reference images may be divided into multiple areas identified in the model-based feature map. Each set of areas containing a test image area and a corresponding reference image area may be inspected individually. MEEFs, user defined thresholds, geometrical map, and other information specific for each area may be used in this operation. In other words, analyzing test image may involve identifying portions of the test images and corresponding portions of the reference images and identifying any differences in these images for each identified portion. In a specific embodiment, differences are identified between aligned test transmission image and the aligned reference transmission image and between the aligned test reflection image and the aligned reference reflection image.

In certain embodiments, inspection is applied to multiple tone masks as well. One example of such masks are tri-tone masks having a darkest region (e.g., a chrome or opaque regions) and a quartz or lightest region with a pattern of grey scale regions having a darkness between the two. Such grey scale regions can be obtained in a number of ways (e.g., using EPSM materials and so on). In this case, the mask is treated as two different masks that are separately analyzed. For example, a tri-tone mask can be treated using the same models as described above. However, the tri-tone mask can be treated as a mask having a background pattern (e.g., chromium) with the grey scale pattern (e.g., EPSM material) treated as the foreground. The images can be processed as above using the same equations and process operations. A second analysis is performed on the mask using the EPSM material as the background pattern and the lightest pattern (e.g., the quartz) treated as the foreground. Alignment can easily be effectuated because each of the materials have substantially differing properties that demonstrate different edge effects which can be used to align the images. The mask patterns can then be summed and then compared to references in die-to-die or die-to-database comparisons to verify wafer pattern correctness through out the process window and to identify lithographically significant defects.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method for inspecting a photomask to identify lithographically significant defects, the method comprising:
   providing the photomask comprising one or more printable features and one or more non-printable features, the photomask configured to achieve lithographic transfer of the one or more printable features onto a substrate using a lithography system;
   producing test light intensity images of the photomask using an inspection apparatus, the test light intensity images comprising a test transmission image and a test reflection image;
   constructing a band limited mask pattern;
   providing a model of the lithography system to be employed in the lithographic transfer;
   constructing an aerial image of the band limited mask pattern by applying the model of the lithography system to the band limited mask pattern, wherein constructing the aerial image comprises separating the one or more non-printable features from the one or more printable features based on optical intensity distributions in the aerial image;
   building a model-based feature map using the aerial image of the mask pattern,
   wherein the model-based feature map differentiates between the one or more printable features and the one or more non-printable features; and
   analyzing the test light intensity images using the model-based feature map to identify any lithographically significant defects.

2. The method of claim 1, further comprising obtaining reference light intensity images of the photomask, the reference light intensity images comprising a reference transmission image and a reference reflection image of a reference die.

3. The method of claim 2, wherein the band limited mask pattern is constructed using the reference light intensity images.

4. The method of claim 2, further comprising aligning the test light intensity images and the reference light intensity images with respect to each other.

5. The method of claim 4, wherein aligning comprises:
   aligning the test transmission image with respect to the test reflection image;
   aligning the reference transmission image with respect to the reference reflection image; and
   aligning the reference transmission image with respect to the test transmission image or aligning the reference reflection image with respect to the test reflection image.

6. The method of claim 4, wherein analyzing the test light intensity images based on the model-based feature map comprises:
   identifying portions of the aligned test light intensity images and corresponding portions of the aligned reference light intensity images; and
   identifying any differences between the aligned test transmission image and the aligned reference transmission image and between the aligned test reflection image and the aligned reference reflection image for each identified portion.

7. The method of claim 6, wherein the identified portions containing the one or more printable features are inspected with higher sensitivity than the identified portions containing the one or more non-printable features.

8. The method of claim 6, wherein the model-based feature map comprises areas corresponding to the identified portions containing the one or more non-printable features.

9. The method of claim 1, wherein building the model-based feature map comprises identifying low light intensity areas and high light intensity areas of the aerial image.

10. The method of claim 1, wherein analyzing the test light intensity images using the model-based feature map comprises aligning the test light intensity images with the model-based feature map.

11. The method of claim 2, wherein the reference light intensity images are obtained from a database model of a printed pattern.

12. The method of claim 2, wherein the reference light intensity images are obtained from a reference die.

13. The method of claim 1, wherein the one or more non-printable features comprises Sub-Resolution Assist Features (SRAF).

14. The method of claim 1, wherein at least one of the non-printable features is larger than at least one of the printable features.

15. The method of claim 1, wherein constructing the aerial image comprises excluding the one or more non-printable features from the aerial image.

16. The method of claim 1, further comprising constructing a geometrical map based on the band limited mask pattern for classifying geometrical features into one or more geometrical feature types selected from the group consisting of edges, corners, and line ends.

17. The method of claim 16, further comprising using the geometrical map to classify the geometrical features during analyzing of the test images.

18. The method of claim 17, wherein analyzing the test images comprises applying different detection thresholds to at least two different geometrical feature types of the geometrical map.

19. The method of claim 1, wherein the model-based feature map comprises a plurality of areas each having a corresponding Mask Error Enhancement Factor (MEEF).

20. The method of claim 19, further comprising, during analyzing of the test images, automatically adjusting sensitivity levels for each image portion of the plurality of areas based on the corresponding MEEFs.

21. The method of claim 20, wherein a subset of the plurality of areas corresponding to the one or more printable features is analyzed with higher sensitivity than another subset of the plurality of areas corresponding to the one or more non-printable features.

22. The method of claim 1, further comprising providing one or more user-defined sensitivity levels for analyzing the test image.

23. The method of claim 22, wherein the one or more user-defined sensitivity levels corresponds to different areas of the model-based feature map.

24. The method of claim 1, wherein the band limited mask pattern comprises only linear terms.

25. The method of claim 1, wherein the band limited mask pattern comprises one or more quadratic terms.

26. The method of claim 1, wherein the model of the lithography system comprises at least the following parameters: numerical apertures of the lithographic system and the inspection apparatus, wavelengths of the lithographic system and the inspection apparatus, and illumination conditions of the lithographic system and the inspection apparatus.

27. The method of claim 1, wherein constructing the aerial image comprises removing band limiting effects of the inspection apparatus.

28. A system for inspecting a photomask to identify lithographically significant defects comprising at least one memory and at least one processor configured to perform following operations:

produce test light intensity images of the photomask, the test light intensity images comprising a test transmission image and a test reflection image;

constructing a band limited mask pattern;

constructing an aerial image of the band limited mask pattern by applying a lithography system model to the band limited mask pattern, wherein constructing the aerial image comprises separating one or more non-printable features from one or more printable features based on optical intensity distributions in the aerial image;

building a model-based feature map using the aerial image of the mask pattern, wherein the model-based feature map differentiates between the one or more printable features and the one or more non-printable features; and analyzing the test light intensity images using the model-based feature map to identify any lithographically significant defects.

* * * * *